(12) United States Patent
Fan et al.

(10) Patent No.: US 9,143,141 B2
(45) Date of Patent: Sep. 22, 2015

(54) APPARATUS AND METHODS FOR POWER QUALITY MEASUREMENT

(75) Inventors: Chun Fan, Johns Creek, GA (US); Paul Terricciano, Roswell, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 768 days.

(21) Appl. No.: 12/897,239

(22) Filed: Oct. 4, 2010

(65) Prior Publication Data

US 2011/0080197 A1    Apr. 7, 2011

Related U.S. Application Data

(60) Provisional application No. 61/248,692, filed on Oct. 5, 2009.

(51) Int. Cl.
| | |
|---|---|
| *G01R 19/02* | (2006.01) |
| *H03L 7/16* | (2006.01) |
| *G01R 19/25* | (2006.01) |
| *G01R 19/175* | (2006.01) |

(52) U.S. Cl.
CPC  *H03L 7/16* (2013.01); *G01R 19/02* (2013.01); *G01R 19/175* (2013.01); *G01R 19/2513* (2013.01)

(58) Field of Classification Search
CPC ....... G01R 19/02; G01R 19/2513; H03L 7/16
USPC ................... 702/75, 64, 57, 77, 60
See application file for complete search history.

(56) References Cited

U.S. PATENT DOCUMENTS

| | | | |
|---|---|---|---|
| 5,828,983 A * | 10/1998 | Lombardi ................ | 702/66 |
| 6,380,692 B1 * | 4/2002 | Newman et al. .......... | 315/194 |
| 6,516,279 B1 * | 2/2003 | Jansen et al. ............ | 702/66 |
| 2006/0212238 A1 * | 9/2006 | Nisenblat et al. ........ | 702/66 |

* cited by examiner

*Primary Examiner* — Sujoy Kundu
*Assistant Examiner* — Ricky Ngon (57) ABSTRACT

A method for measuring characteristics of a power line signal having a fundamental frequency is provided. The method includes estimating the fundamental frequency of the power line signal, and generating a sampling clock that is substantially synchronized to the estimated fundamental power line frequency. The power line signal is sampled with the substantially synchronized sampling clock to generate data samples that include one or more substantially complete cycles of the power line signal. The data samples are processed to detect zero crossings of the power line signal, and the detected zero crossings are used to calculate an r.m.s. voltage of the power line signal measured over one full cycle, commencing at a zero crossing, and refreshed each half-cycle. Other aspects are also provided.

30 Claims, 5 Drawing Sheets

APPARATUS AND METHODS FOR POWER QUALITY MEASUREMENT

REFERENCE TO RELATED APPLICATIONS

This application claims the benefit of U.S. Provisional Patent Application Ser. No. 61/248,692, filed 5 Oct. 2009, which is incorporated by reference herein in its entirety for all purposes.

BACKGROUND

This invention relates to apparatus and methods for power quality measurement. In particular, this invention relates to apparatus and methods for detecting and measuring characteristics of dips, swells and interruptions in AC power systems.

Voltage dips, swells, and interruptions are short-duration disturbances in AC power systems (referred to herein as "DSI Disturbances"). Voltage dips are brief reductions in voltage magnitude lasting anywhere from milliseconds to a few seconds. Voltage swells are brief increases in voltage magnitude lasting anywhere from milliseconds to a few seconds. Voltage interruptions are more severe decreases in voltage magnitude. The threshold for voltage interruptions is usually less than 10% of nominal voltage.

Various industry standards define characteristics of DSI Disturbances, and also specify methods to measure the duration and magnitude of DSI Disturbances. However, the power line frequency (e.g., 60 Hz in the US, and 50 Hz in Europe) may vary by ±15% of nominal, which makes it very difficult to accurately detect and measure characteristics of DSI Disturbances. Accordingly, improved systems and methods for detecting and measuring characteristics of DSI Disturbances are desirable.

SUMMARY

In a first aspect of the invention, a method for measuring characteristics of a power line signal having a fundamental frequency is provided. The method includes estimating the fundamental frequency of the power line signal, and generating a sampling clock that is substantially synchronized to the estimated fundamental power line frequency. The power line signal is sampled with the substantially synchronized sampling clock to generate data samples that include one or more substantially complete cycles of the power line signal. The data samples are processed to detect zero crossings of the power line signal, and the detected zero crossings are used to calculate an r.m.s. voltage of the power line signal measured over one full cycle, commencing at a zero crossing, and refreshed each half-cycle.

In a second aspect of the invention, an apparatus for measuring characteristics of a power line signal having a fundamental frequency is provided. The apparatus includes means for estimating the fundamental frequency of the power line signal, means for generating a sampling clock that is substantially synchronized to the estimated fundamental power line frequency, means for sampling the power line signal with the substantially synchronized sampling clock to generate data samples that include one or more substantially complete cycles of the power line signal, means for processing the data samples to detect zero crossings of the power line signal, and means for using the detected zero crossings to calculate $U_{rms(1/2)}$, the r.m.s. voltage of the power line signal measured over one full cycle, commencing at a zero crossing, and refreshed each half-cycle.

In a third aspect of the invention, an apparatus for measuring characteristics of a power line signal having a fundamental frequency is provided. The apparatus includes an analog-to-digital ("A/D") converter having input terminals coupled to the power line signal, a sampling clock input terminal coupled to a sampling clock having a sampling rate, and digital output terminals, wherein the A/D converter provides digital samples of the power line signal at the sampling rate at the digital output terminals. The apparatus also includes a digital signal processor ("DSP") having input terminals coupled to the digital output terminals of the A/D converter, and an output terminal, wherein the DSP processes the digital samples of the power line signal to estimate the fundamental frequency of the power line signal, and provides a control signal at the output terminal based on the estimated fundamental power line frequency. The apparatus additionally includes a programmable phase locked loop ("PLL") clock generator having a control terminal coupled to the output terminal of the DSP, wherein the PLL clock generator provides a clock signal that is substantially synchronized to the estimated fundamental power line frequency to the sampling clock input terminal of the A/D converter.

Other features and aspects of the present invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout, and in which.

DETAILED DESCRIPTION

Each year, millions of dollars are lost due to DSI Disturbances. In particular, voltage dips may starve equipment of power needed to properly function, which may cause machinery lock-ups and computer crashes. Although voltage swells occur less frequently than voltage dips, the effects of voltage swells often can be more devastating that those of voltage dips. For example, the overvoltage condition of a voltage swell may cause breakdown of components on power supplies, although the effect may be a gradual, cumulative effect. Voltage interruptions are more severe decreases in voltage magnitude, which may cause substantial equipment downtime and damage resulting from post-interruption inrush.

As a result, substantial efforts have been made to monitor such variations in AC power systems, and several power quality standards have been developed. For example, IEC 61000-4-30 (10-2008) (referred to herein as the "IEC Standard") is an international standard that prescribes methods to measure the duration and magnitude of DSI Disturbances. For example, the IEC Standard requires that a Class A-certified meter calculate the r.m.s. voltage of a power line signal measured over one full cycle, commencing at a zero crossing, and refreshed each half-cycle. The calculated r.m.s. voltage is commonly referred to as "$U_{rms(1/2)}$." The IEC Standard specifies that errors on $U_{rms(1/2)}$ measurements be within ±0.2% of nominal voltage.

To identify a DSI Interruption on a power line signal, the $U_{rms(1/2)}$ measurement is compared to various predetermined thresholds to determine if a dip, a swell, or an interruption has occurred on the power line signal. For poly-phase power systems, the standard requires that zero crossings are identified on each individual voltage channel, and that the $U_{rms(1/2)}$ measurements are performed on each channel. For example, for three-phase power systems, if line-to-line voltages are monitored for disturbances, zero crossings of $v_{ab}$, $v_{bc}$, and $v_{ca}$ voltage signals must be calculated.

The IEC Standard requires calculating $U_{rms(1/2)}$ based on one full cycle of the power line signal, because r.m.s. voltage measurements accuracy depends on calculations based on full cycles of samples. Previously known power quality measurement techniques, however, are inadequate to meet the IEC Standard for evaluating voltages dips, swells, and interruptions.

In particular, power line frequencies may vary within ±15% of nominal values. If a fixed sampling frequency is used to sample the power line signal, the sampled data may not capture complete cycles of the power line signal. For example, if a fixed sampling clock of 7.68 kHz is used to sample a 60 Hz power line signal, one complete cycle of the power line signal includes 128 samples. If the power line frequency changes to 62 Hz, however, 128 samples will include more than one complete cycle. Likewise, if the power line frequency changes to 58 Hz, 128 samples will result in less than one complete cycle. In such instances, if $U_{rms(1/2)}$ is calculated based on the 128 data samples, the r.m.s. voltage errors are significantly greater than the 0.2% limit specified by the IEC Standard. Further, $U_{rms(1/2)}$ calculations based on sample sets containing partial cycles will result in significant errors.

To reduce such errors, apparatus and methods in accordance with this invention generate an estimate of a fundamental frequency of a power line signal. A sampling clock is then generated that is substantially synchronized to the estimated fundamental power line frequency. For example, the sampling clock typically is a multiple of the estimated fundamental power line frequency. The power line signal is then sampled with the substantially synchronized sampling clock to generate data samples that include one or more substantially complete cycles of the power line signal.

The data samples are then processed to detect zero crossings of the power line signal. In particular, the fundamental phase of the power line signal is calculated, and the calculated fundamental phase is used to detect zero crossings of the power line signal. If the power line signal $v_{in}$ is a multi-phase signal (e.g., a three-phase power line), zero crossings of each phase are detected.

The $U_{rms(1/2)}$ values of each phase are calculated based on the detected zero crossings, and the calculated $U_{rms(1/2)}$ values are compared to predetermined thresholds to determine if dips, swells or interrupts have occurred on the power line. If a DSI Disturbance is detected, the duration of the disturbance optionally may be measured. In addition, a time stamp optionally may be applied to identified DSI disturbances, and the time stamp value maybe saved in memory along with the calculated $U_{rms(1/2)}$ values and duration data.

Figure 1:
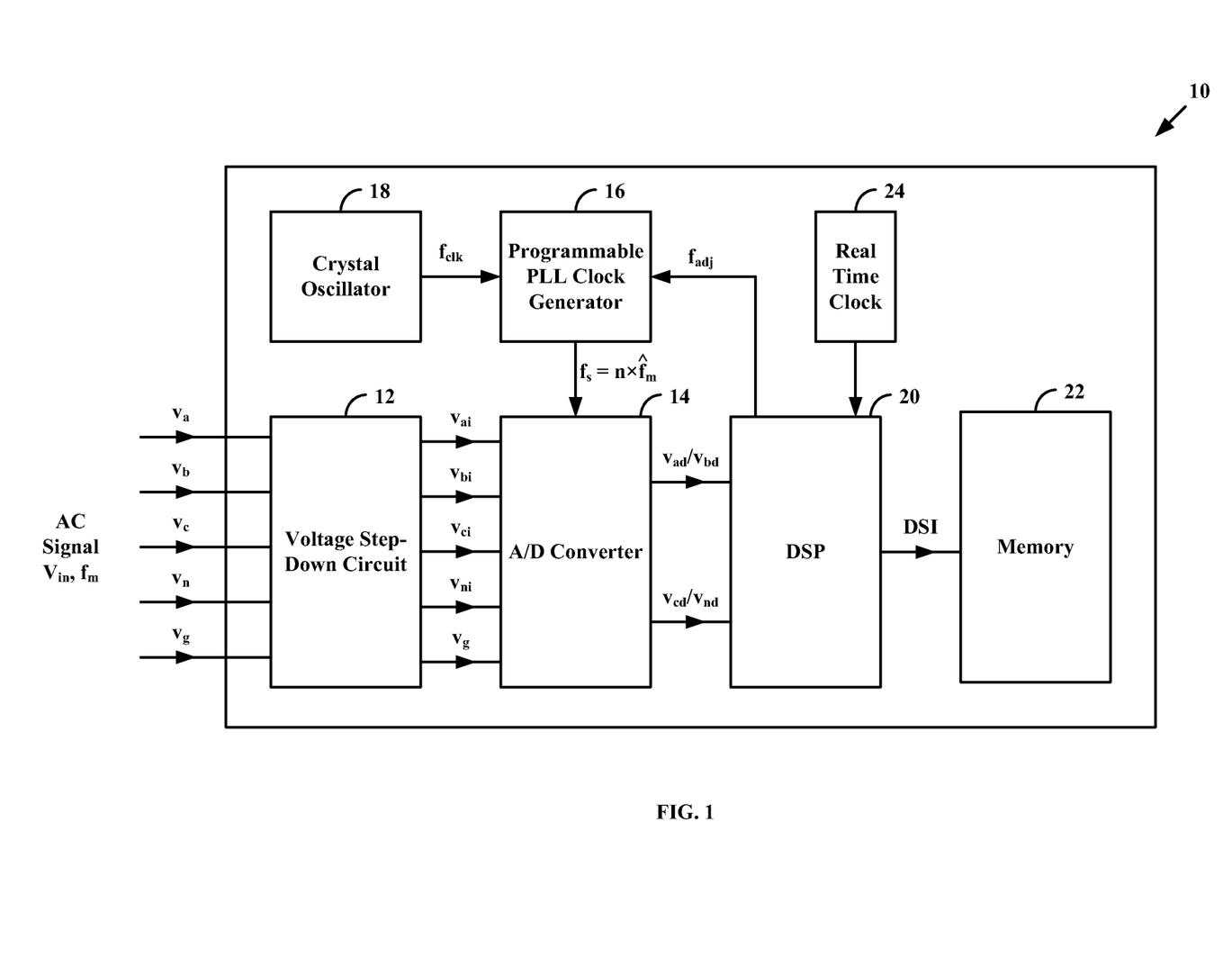
FIG. 1 is a diagram of an exemplary power quality measurement device in accordance with this invention.

Referring to FIG. 1, an exemplary power quality measurement device 10 in accordance with this invention is described. Power quality measurement device 10 includes a voltage step-down circuit 12, an analog-to-digital ("A/D") converter 14, a programmable phase-locked loop ("PLL") clock generator 16, a crystal oscillator 18, a digital signal processor ("DSP") 20, a memory 22 and a real time clock 24. Persons of ordinary skill in the art will understand that although the various components are depicted as separate devices, one or more of the devices may be combined. For example, DSP 20 may include on-chip memory, which may include some or all of memory 22. Power quality measurement device 10 also may include other circuits (not shown), such as communication ports, digital output circuits, and other similar circuits.

Voltage step down circuit 12 has input terminals coupled to an analog signal $v_{in}$ (e.g., a power line signal) to be monitored, and provides analog output signals to A/D converter 14. Voltage step down circuit 12 converts AC input signal levels (e.g., 240 VAC, 480 VAC) down to signal levels suitable for analog inputs of A/D converter 14 (e.g., +/−1 volts). For example, voltage step down circuit 12 may include a step-down converter, as is known in the art.

In addition, voltage step down circuit 12 may provide isolation for downstream digital circuits. For example, voltage step down circuit 12 may include an optical isolator to isolate low voltage DC circuits in power quality measurement device 10 from the high voltage AC circuits of voltage step down circuit 12. For improved noise immunity, voltage step down circuit 12 may include circuitry to provide differential analog output signals to A/D converter 14.

Power quality measurement device 10 may be used to measure single phase or multi-phase AC signals. In the exemplary embodiment shown in FIG. 1, power quality measurement device 10 is shown coupled to a three-phase AC input signal $v_{in}$ that has a fundamental frequency $f_m$, and includes three phase signals $v_a$, $v_b$ and $v_c$, plus neutral $v_n$ and ground $v_g$ (e.g., such as the voltage supplied by a three-phase power system). Accordingly, voltage step-down circuit 12 has input terminals coupled to the analog signals $v_a$, $v_b$, $v_c$, $v_n$ and $v_g$, and provides stepped-down analog output signals $v_{ai}$, $v_{bi}$, $v_{ci}$, $v_{ni}$ and $v_g$. Persons of ordinary skill in the art will understand that power quality measurement devices in accordance with this invention alternatively may be used to detect DSI Disturbances on AC input signals having fewer than or more than three phases.

A/D converter 14 receives a sampling clock $f_s$ from Programmable PLL Clock Generator 16, samples analog input signals $v_{ai}$, $v_{bi}$, $v_{ci}$, $v_{ni}$ and $v_g$ at sampling rate $f_s$, and then converts the sampled analog data to digital output signals $v_{ad}$, $v_{bd}$, $v_{cd}$ and $v_{nd}$. Persons of ordinary skill in the art will understand that A/D Converter 14 alternatively may sample analog input signals $v_{ai}$, $v_{bi}$, $v_{ci}$, $v_{ni}$ and $v_g$ at a multiple (e.g., 2×) or a fraction (e.g., 0.5×) of sampling clock $f_s$.

A/D converter 14 may be a 16-bit successive approximation, sigma-delta or other similar converter. For example, A/D converter 14 may be a ADS8556 A/D converter supplied by Texas Instruments Inc., Dallas, Tex., Other similar converters, and converters having other bit lengths may be used. A/D converter 14 may provide digital output signals $v_{ad}$, $v_{bd}$, $v_{cd}$ and $v_{nd}$ in parallel, Inter-IC Sound ("I²S") format, time division multiplexed ("TDM") format, or other similar format. In the example illustrated in FIG. 1, A/D converter 14 provides digital output signals $v_{ad}$ and $v_{bd}$, and $v_{cd}$ and $v_{nd}$ in I²S format.

Programmable PLL Clock Generator 16 receives an input clock signal $f_{clk}$ from crystal oscillator 18 and a PLL control signal $f_{adj}$ from DSP 20, and provides sampling clock $f_s$ to A/D converter 14. For example, Programmable Clock Generator 16 may be a CDCE913 programmable clock generator supplied by Texas Instruments Inc., Dallas, Tex., or may be any other similar programmable clock generator.

As described in more detail below, in accordance with this invention, DSP 20 receives digital input signals $v_{ad}$, $v_{bd}$, $v_{cd}$ and $v_{nd}$, and processes the digital data to generate an estimate $\widehat{f_m}$ of fundamental power line frequency $f_m$. DSP 20 generates PLL control signal $f_{adj}$ based on the estimated fundamental power line frequency $\widehat{f_m}$, and Programmable PLL Clock Generator 16 uses PLL control signal $f_{adj}$ to generate a sampling clock $f_s$ that is substantially synchronized to the estimated fundamental power line frequency $\widehat{f_m}$. For example, $f_s = n \times \widehat{f_m}$, where n is an integer, such as 64, 128, or other integer value.

In this regard, after substantially synchronizing sampling clock $f_s$ to the estimated fundamental power line frequency $\widehat{f_m}$, A/D converter 14 will generate data samples that include one or more substantially complete cycles of the power line signal. For example, if $f_m$ (and $\widehat{f_m}$) is 60 Hz, a sampling clock $f_s$ of 7.68 kHz will result in 128 samples per fundamental cycle. If $f_m$ (and $\widehat{f_m}$) changes to 65 Hz, the sampling clock $f_s$ will be changed to 8.32 kHz so that there are still 128 samples per fundamental cycle.

DSP 20 may process digital input signals $v_{ad}$, $v_{bd}$, $v_{cd}$ and $v_{nd}$, to calculate line-to-line voltages (e.g., $v_{ab}$, $v_{bc}$, $v_{ca}$) and line-to-neutral voltages (e.g., $v_{an}$, $v_{bn}$, $v_{cn}$), and may store the data in floating point or integer format. In accordance with this invention, DSP 20 may calculate fundamental frequency $\widehat{f_m}$ using either line-to-line or line-to-neutral voltages.

As previously mentioned, $U_{rms(1/2)}$ values are measured over one full cycle, commencing at a zero crossing. Thus, in accordance with this invention, and as described in more detail below, DSP 20 processes the substantially synchronized digital input signals (e.g., line-to-line voltages $v_{ab}$, $v_{bc}$, $v_{ca}$ or line-to-neutral voltages $v_{an}$, $v_{bn}$, $v_{cn}$) to detect zero crossings in the sampled power line signal, calculates $U_{rms(1/2)}$ values based on the data samples, compares the calculated $U_{rms(1/2)}$ values to predetermined threshold values to determine if dips, swells or interrupts have occurred on the power line.

Further, in accordance with this invention, and as described in more detail below, DSP 20 optionally may measure the duration of detected dips, swells and/or interrupts. In addition, DSP 20 may apply a time stamp to detected DSI Disturbances, and may save the time stamp data in memory along with the calculated $U_{rms(1/2)}$ values and duration data.

DSP 20 may be any conventional DSP circuit. For example, DSP 20 may be a TMS320C6713B floating point digital signal processor supplied by Texas Instruments, Inc., or may be any other similar processor.

Figure 2:
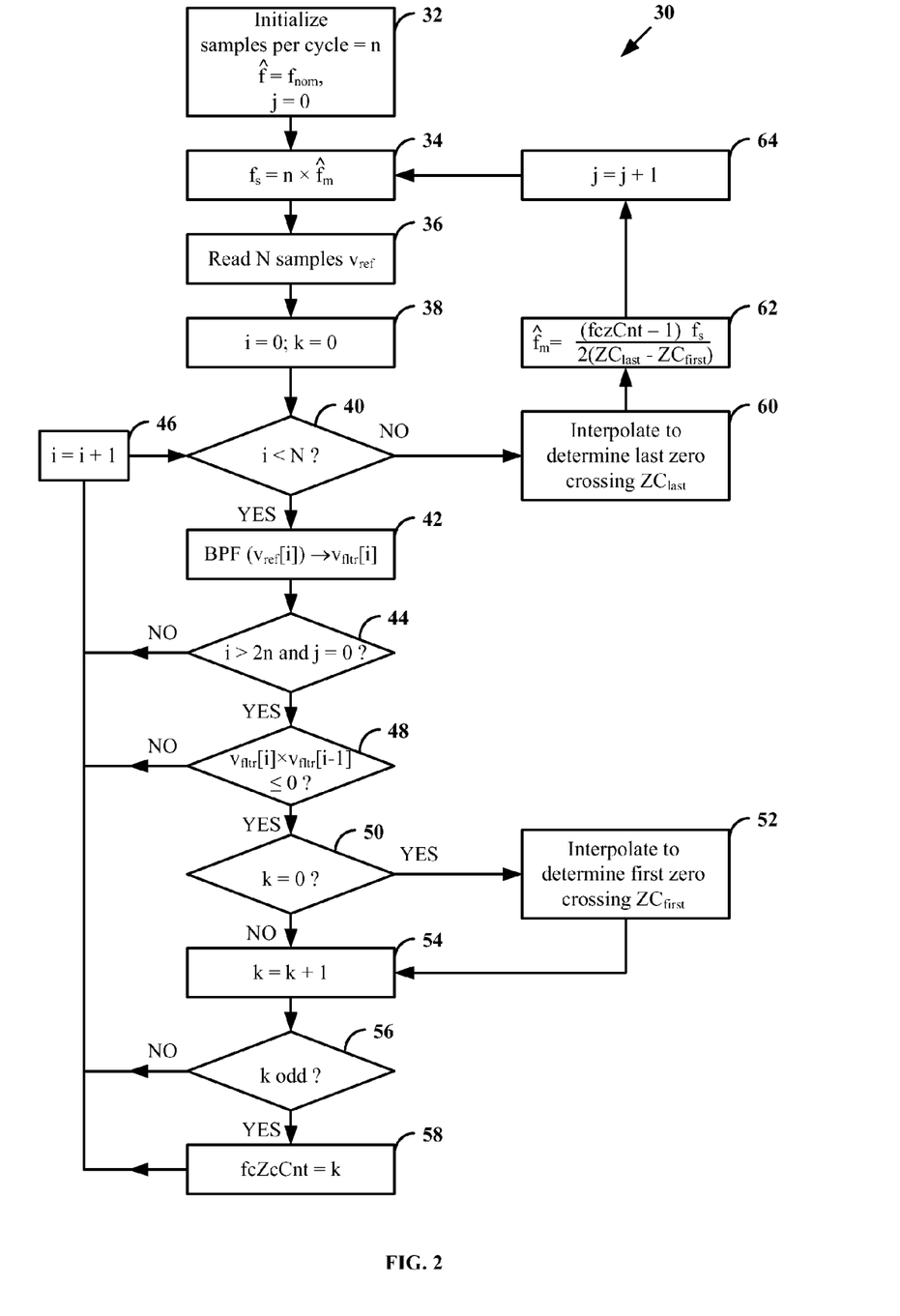
FIG. 2 is flow chart of an exemplary process in accordance with this invention for substantially synchronizing a sampling clock to an estimated fundamental frequency of a power line signal.

Referring now to FIG. 2, an exemplary process 30 used to substantially synchronize sampling clock $f_s$ to estimated fundamental power line frequency $\widehat{f_m}$ is described. For example, DSP 20 may implement exemplary process 30 to generate PLL control signal $f_{adj}$ to substantially synchronize sampling clock $f_s$ to estimated fundamental power line frequency $\widehat{f_m}$.

In general, there are no significant differences between fundamental frequencies of voltage channels of poly-phase public power networks. Accordingly, exemplary devices and methods in accordance with this invention use a single voltage channel (e.g., $v_{ab}$, $v_{bc}$, $v_{ca}$, $v_{an}$, $v_{bn}$, or $v_{cn}$) to calculate $\widehat{f_m}$. Persons of ordinary skill in the art will understand that exemplary devices and methods alternatively may use more than one voltage channel to calculate $\widehat{f_m}$. In the block diagram depicted in FIG. 2, the selected voltage channel is referred to as $v_{ref}$.

Beginning at step 32, the process is initialized by setting the number of samples per cycle n and an initial value for the estimated fundamental power line frequency $\widehat{f_m}$. For example, the number of samples per cycle n can be set to 64 or 128 samples per cycle, and the initial value of $\widehat{f_m}$ can be set to the nominal power line frequency $f_{nom}$ (e.g., 60 Hz for U.S. and 50 Hz for Europe). Persons of ordinary skill in the art will understand that other samples per cycle values, and other initial $\widehat{f_m}$ values may be used. An index j is used to designate the number of complete cycles, and is set to an initial value of 0.

At step 34, the A/D sampling clock $f_s$ is set to $f_9 = n \times \widehat{f_m}$. Next, at step 36, DSP 20 reads in N samples of $v_{ref}$, where N is a multiple of n, such as N=640, when n=64. Persons of ordinary skill in the art will understand that other values of N may be used. When sampling is substantially synchronized to fundamental power line frequency $f_m$, integer m=N/n will equal the number of complete cycles.

At step 38, indexes i and k are set to 0, and the process loops through the samples. Index i represents the sample number, i=0, 1, 2, ..., N−1, and index k represents the number of zero crossings in the sample set, k=0, 1, ..., 2m+1. At step 40, sample index i is compared to N to determine if a total of N samples have been processed. If i<N, the process proceeds to step 42 to filter $v_{ref}[i]$.

In particular, the fundamental frequencies of public power networks are usually within the range from 40 Hz to 70 Hz, so at step 42, the samples $v_{ref}[i]$ are filtered using a bandpass filter to remove frequencies outside this range. The filtered output samples are $v_{fltr}[i]$. The bandpass filter has a center frequency $f_c$ and a bandwidth BW. For example, center frequency $f_c$ may be 55 Hz, and bandwidth BW may be 50 Hz, although other center frequencies and bandwidths may be used.

The bandpass filter may be implemented as a digital filter or as an analog filter. In the exemplary embodiment described herein, the bandpass filter is a digital filter implemented in direct form II to reduce the filter delay, although other forms may be used.

An exemplary digital bandpass filter in accordance with this invention may be expressed by the following equations:

$$v_{fltr}(i) = b_0 w(i) + b_1 w(i-1) + b_2 w(i-2) \quad (1)$$

where $$w(i) = v_{ref}(i) + a_1 w(i-1) + a_2 w(i-2) \quad (2)$$

$$b_0 = 1 - S \quad (3)$$

$$b_1 = 2(S - R)\cos(2\pi f_{cnom}) \quad (4)$$

$$b_2 = R^2 - S \quad (5)$$

$$a_1 = 2R\cos(2\pi f_{cnom}) \quad (6)$$

$$a_2 = -R^2 \quad (7)$$

$$R = 1 - 3BW_{nom} \quad (8)$$

-continued $$S = \frac{1 - 2R\cos(2\pi f_{cnom}) + R^2}{2 - 2\cos(2\pi f_{cnom})} \quad (9)$$

$$f_{cnom} = \frac{f_c}{f_f} \quad (10)$$

$$BW_{nom} = \frac{BW}{f_f} \quad (11)$$

$$f_f = n \times f_c \quad (12)$$

where w(i−1) and w(i−2) are intermediate variables called delays and are initialized to zero. The coefficients $a_1$, $a_2$, $b_0$, $b_1$, $b_2$ of the band pass filter are constants, which can be pre-calculated and stored in memory in DSP 20.

Figure 3:
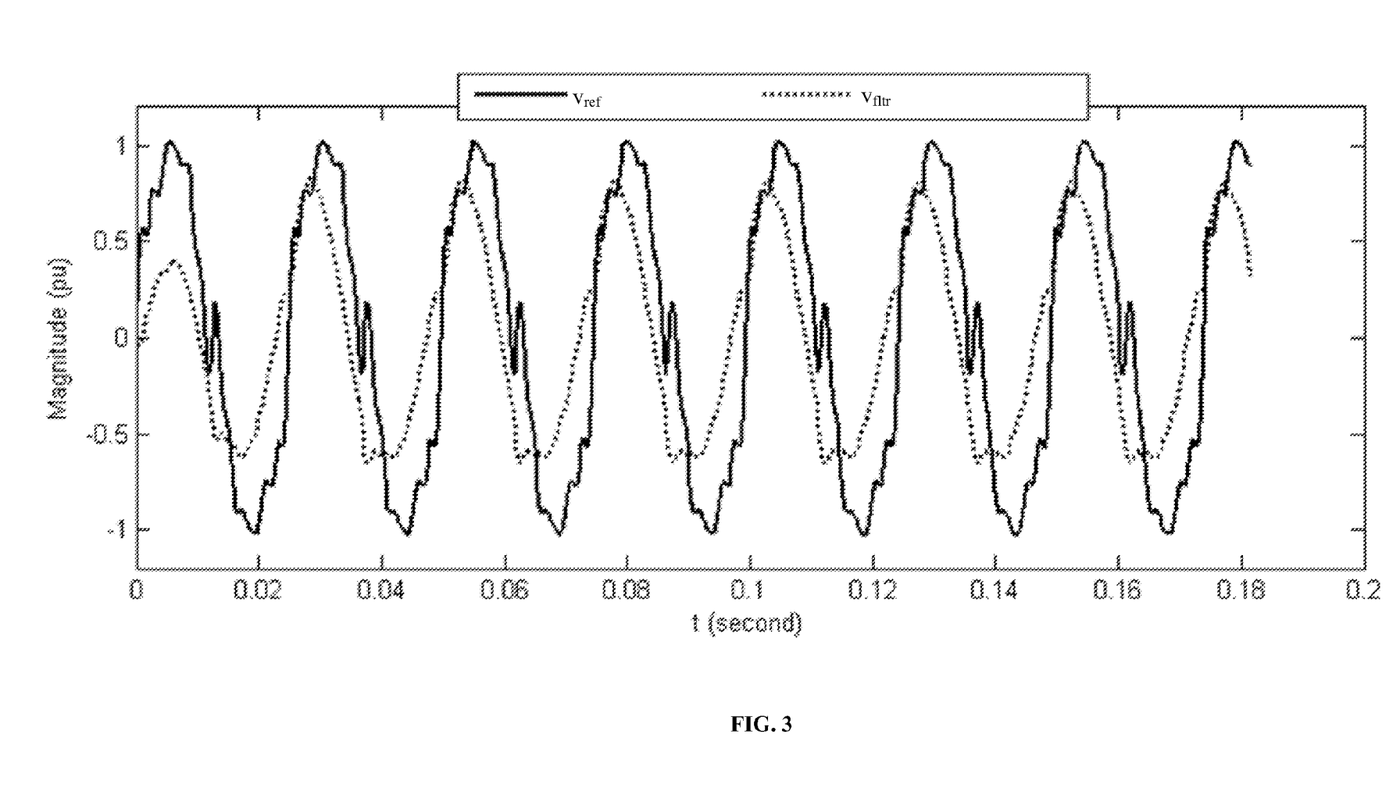
FIG. 3 is a diagram of unfiltered and filtered samples of a power line signal using an exemplary bandpass filter in accordance with this invention.

FIG. 3 illustrates exemplary $v_{ref}[i]$ (unfiltered) and $v_{fltr}[i]$ (filtered) sample waveforms. The diagram illustrates that with the exemplary bandpass filter set forth above, the filtered output signal $v_{fltr}[i]$ settles after approximately two cycles of filtered samples. Thus, referring again to FIG. 2, at steps 44 and 45, the first two cycles of samples are skipped for zero crossing detection. That is, if j=0, the process proceeds to step 48 only if i>2n. Otherwise, the process proceeds to step 46, where index i is incremented by 1, and the process returns to step 40. For all j>0, the process proceeds to step 48.

At step 48, the process checks for sign changes and zero points to identify zero crossing between successive samples. That is, if $$[v_{fltr}(i) \times v_{fltr}(i-1)] \leq 0 \quad (13)$$

a zero crossing has been identified, and the method proceeds to step 50. If the product in equation (13) is not less than or equal to zero, a zero crossing has not been identified, and the process returns to step 46, where index i is incremented by 1, and the process returns to step 40.

If a zero crossing is identified at step 48, the process proceeds to step 50 to determine if k=0, which indicates that the first zero crossing has been identified. If so, the process proceeds to step 52 to determine the index $ZC_{first}$ of the first zero crossing. Because actual zero crossings can fall somewhere between $v_{fltr}(i)$ and $v_{fltr}(i-1)$, the actual zero crossing indexes $ZC_{indx}$ are derived by linear interpolation and are floating point numbers between i and i−1:

$$ZC_{indx} = i + \frac{v_{fltr}(i)}{v_{fltr}(i-1) - v_{fltr}(i)} \quad (14)$$

Thus, at step 50, if k=0, $ZC_{first}$ is calculated in accordance with equation (14). If, however, k does not equal 1, the zero crossing identified at step 48 is not the first zero crossing, and the process proceeds to step 54, and index k is incremented by 1.

Without wanting to be bound by any particular theory, it is believed that when harmonics are present in AC signals, frequencies measured on an odd number of half cycles are not accurate. Thus, to improve accuracy, exemplary processes in accordance with this invention calculate the estimated fundamental power line frequency $\widehat{f_m}$ based on data sets that include full cycles of the power line signal.

The relationship between the number of zero crossings $NUM_{zc}$ and number of full cycles $NUM_{fc}$ is $NUM_{zc}=2\times NUM_{fc}+1$, so $NUM_{zc}$ is an odd number for full cycles of data. Therefore, at step 56, the process determines if zero crossing counter k is an odd number to make sure frequencies are measured on full cycles. If k is not an odd number, the process loops back to step 46, and index i is incremented by 1. If k is an odd number, the process proceeds to step 58, where a full cycle zero crossing counter, fcZcCnt, is set equal to the value of zero crossing counter k. The process then loops back to step 46, and index i is incremented by 1.

At step 40, if sample index i is equal to N, indicating that all samples have been filtered, the process proceeds to step 60 to determine the index $ZC_{last}$ of the last zero crossing, in accordance with equation (14), above.

Next, at step 62, after looping through all the samples, the estimated fundamental power line frequency $\widehat{f_m}$ is derived as:

$$\widehat{f_m} = \frac{(fcZcCnt - 1) \times f_{ad}}{2 \times (ZC_{last} - ZC_{first})} \quad (15)$$

At step 64, index j is incremented by 1, and the process loops back to step 34, where the A/D sampling rate $f_s$ is adjusted based on the new $\widehat{f_m}$. At step 36, DSP 20 reads in a new set of N samples of $v_{ref}$, and the process repeats. Persons of ordinary skill in the art will understand that this process may be repeated for a specified number of iterations, or until an error level falls below a predetermined threshold, or until some other criterion has been satisfied.

Exemplary process 30 has been tested with sinusoidal signals of different frequencies, different phases, and different harmonic contents. In one exemplary evaluation, 100 frequencies uniformly distributed from 40 Hz to 70 Hz, and 100 phases uniformly distributed from 0 to 2π were chosen. Combining the different frequencies and phases results in 10,000 test signals. Odd, even, and/or inter harmonics were added to the signals. The initial value of $\widehat{f_m}$ was set to 55 Hz, the number n of samples per cycle was set to 64, and the number N of samples for one iteration was set to 640.

Without wanting to be bound by any particular theory, it is believed that for the 10,000 test signals, after one iteration of process 30, errors on frequency measurements (e.g., [$f_m - \widehat{f_m}$]) are within ±0.015 Hz, and after two iterations, errors on frequency measurements are within ±0.004 Hz. Based on the values of n and N specified above, it is believed that the exemplary process 30 reaches ±0.004 Hz accuracy in less than or equal to 0.5 seconds. The IEC Standard requires ±0.01 Hz accuracy on frequency measurements over 10 seconds of data. Thus, it is believed that the exemplary process meets this requirement.

Without wanting to be bound by any particular theory, it is believed that because of the band pass filter, the interpolation method, and the full cycle zero crossing counter, the exemplary process 30 can accurately generate the estimated fundamental power line frequency $\widehat{f_m}$ even when there are zero crossing jitters caused by noise, harmonics, or inter-harmonics. The exemplary process 30 is computationally efficient because during the m signal cycles, the exemplary process only needs to calculate positions of first and last zero crossings, and it does not need the positions of intermediate zero crossings.

As mentioned above, after substantially synchronizing sampling clock $f_s$ to estimated fundamental power line frequency $\widehat{f_m}$, DSP 20 processes the substantially synchronized digital input signals (e.g., line-to-line voltages $v_{ab}$, $v_{bc}$, $v_{ca}$ or line-to-neutral voltages $v_{an}$, $v_{bn}$, $v_{cn}$) to detect zero crossings of each phase (for a multi-phase system) in the sampled power line signal. Exemplary processes in accordance with this invention detect zero crossings on each phase of a polyphase power line signal with no need of any hardware PLL components on any of the phases.

In particular, DSP 20 calculates fundamental phase angles of each phase using a discrete Fourier transform ("DFT"), and then calculates locations of zero crossings from the calculated fundamental phase angles. In some exemplary embodiments, a modified DFT calculation is performed. That is, some exemplary embodiments only calculate the real part and imaginary part of the DFT at the fundamental frequency to determine the fundamental phase angles. In such embodiments, the modified DFT calculation only requires $2 \times n_{dft}$ multiplications, where $n_{dft}$ is the DFT length. As a result, such exemplary methods to calculate zero crossings are computationally efficient.

Figure 4:
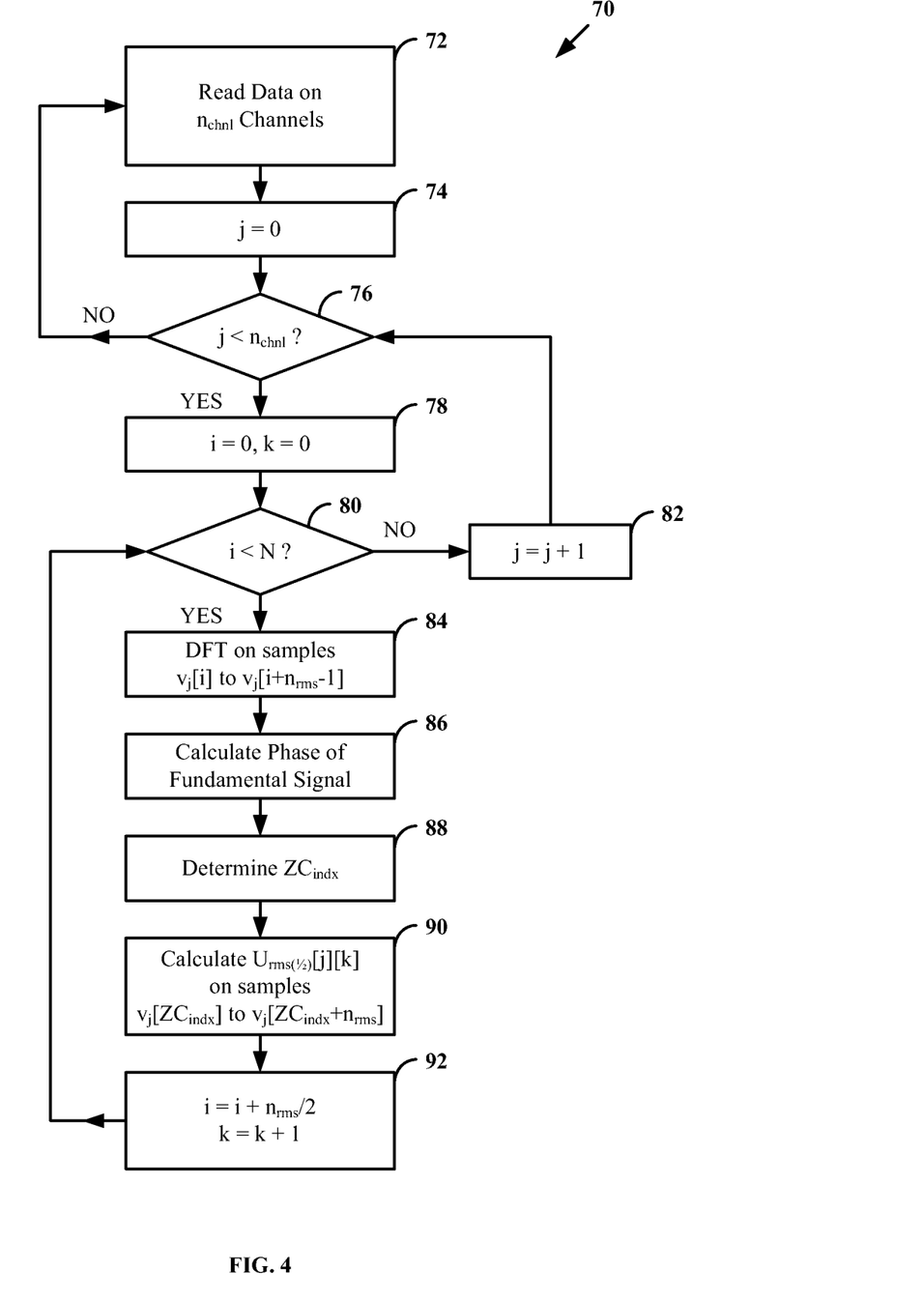
FIG. 4 is a flow chart of an exemplary process in accordance with this invention for calculating r.m.s. voltages on multiple channels of a power line signal.

Referring now to FIG. 4, an exemplary process 70 for detecting zero crossings and calculating $U_{rms(1/2)}$ on $n_{chnl}$ voltage channels (e.g., $n_{chnl}$=3) in accordance with this invention is described. Persons of ordinary skill in the art will understand that $n_{chnl}$ may be less than or greater than 3.

At step 72, DSP 20 reads in $n_{chnl}$ channels of voltage samples each of length N, such as N=640. Other N values may be used. At step 74, channel counter j is set to zero. At step 76, if channel counter j is less than $n_{chnl}$ (meaning all channel samples have not been processed), the process proceeds to step 78. Otherwise, the process proceeds to step 72, and DSP 20 reads in another $n_{chnl}$ channels of voltage samples.

At step 78, sample index i and half-cycle index k are both initialized to zero. At step 80, if sample index is less than N, the process proceeds to step 84. Otherwise, the process proceeds to step 82, where channel index j is incremented by 1.

At step 84, a DFT is performed on one cycle of data using samples $v_j[i]$ to $v_j[i+n_{rms}-1]$, where $n_{rms}$ is the signal sample rate (e.g., 64 samples/cycle). In some embodiments of this invention, the DFT sample rate $n_{dft}$ can be the same as the signal sample rate $n_{rms}$. In alternative embodiments of this invention, however, the DFT sample rate $n_{dft}$ can be different from the signal sample rate $n_{rms}$.

For example, if the signal sample rate $a_{rms}$=64, the DFT sample rate can be $n_{dft}$=32 samples per cycle. In such an embodiment, the DFT is performed on down-sampled data samples (e.g., $v_j[0]$, $v_j[2]$, $v_j[4]$, ..., $v_j[62]$). As previously mentioned, the IEC Standard requires that errors in $U_{rms(1/2)}$ measurements are within ±0.2% of nominal voltage. It is believed that errors in $U_{rms(1/2)}$ measurements when $n_{rms}$=64 and $n_{dft}$=32 are within ±0.02%, which is 10 times smaller than the required ±0.2%.

Next, at step 86, the fundamental phase angle dftPhase of the AC signal on channel j is calculated from the DFT results. In particular, DSP 20 calculates dftPhase as:

$$dftPhase = \operatorname{atan}\left(\frac{\operatorname{Im}X}{\operatorname{Re}X}\right) \quad (16)$$

where ImX is the imaginary part of the fundamental frequency component of the DFT results, and ReX is the real part of the fundamental frequency component of the DFT results, and are given by:

$$\operatorname{Im}X = -\sum_{i=0}^{n_{dft}-1} v_{dft}[i] \times \sin\left(2\pi \frac{i}{n_{dft}}\right) \quad (17)$$

$$\operatorname{Re}X = \sum_{i=0}^{n_{dft}-1} v_{dft}[i] \times \cos\left(2\pi \frac{i}{n_{dft}}\right) \quad (18)$$

where $v_{dft}$ are the DFT sample results.

dftPhase is referenced to a cosine wave with zero phase and is in the range of $[-\pi, +\pi]$. It is necessary to convert dftPhase to zcPhase that is reference to absolute zero and is in the range of $[0, +\pi]$. The following Table 1 shows how to convert dftPhase to zcPhase:

TABLE 1

Conversion of dftPhase to zcPhase

| dftPhase $[-\pi, +\pi]$ | zcPhase $[0, +\pi]$ |
|---|---|
| $-\pi \leq$ dftPhase $\leq -\frac{\pi}{2}$ | zcPhase $= -\frac{\pi}{2} -$ dftPhase |
| $-\frac{\pi}{2} <$ dftPhase $\leq \frac{\pi}{2}$ | zcPhase $= \frac{\pi}{2} -$ dftPhase |
| $\frac{\pi}{2} <$ dftPhase $\leq \pi$ | zcPhase $= \frac{3\pi}{2} -$ dftPhase |

At step 88, zcPhase is then used to obtain zero crossing indexes $ZC_{indx}$ using the following equation:

$$ZC_{indx} = \frac{zcPhase}{2\pi} \times n_{rms} + k \times \frac{n_{rms}}{2} \quad (19)$$

Next, at step 90, $U_{rms(1/2)}$ is then obtained using the following equation:

$$U_{rms(1/2)}[j][k] = \sqrt{\sum_{l=ZC_{indx}}^{ZC_{indx}+n_{rms}} v_j[l]^2} \quad (20)$$

where $j = 0, 1, \ldots, n_{chnl} - 1$ $k = 0, 1, 2, \ldots, \left(\frac{2N}{n_{rms}} - 1\right)$ Next, at step 92, sample index i is incremented by $n_{rms}/2$, and half-cycle index k is incremented by 1. The process then loops back to step 80 to compare sample index i to N. If i is less than N, the process returns to step 84 to calculate $U_{rms(1/2)}$ for the next half-cycle of channel j. Otherwise, at step 82, channel index j is incremented, and the process returns to step 76.

Although not shown in FIG. 4, because samples for two consecutive $U_{rms(1/2)}$ overlap by one half cycle, the last cycle of samples of each voltage channel preferably should be saved before DSP 20 reads in new data.

Referring again to FIG. 1, after calculating $U_{rms(1/2)}$ values, DSP 20 can measure the magnitude of dips, swells, and interruptions by comparing $U_{rms(1/2)}$ to a nominal voltage r.m.s. or to a sliding reference voltage r.m.s., in accordance with the IEC Standard.

The IEC Standard does not, however, provide methods to measure the durations of dips, swells, and interruptions. In accordance with this invention, exemplary methods to measure durations of dips, swells, and interruptions are provided. In particular, exemplary methods in accordance with this invention calculate the durations of dips, swells, and interruptions based on the estimated fundamental power line frequency $\widehat{f_m}$.

Figure 5:
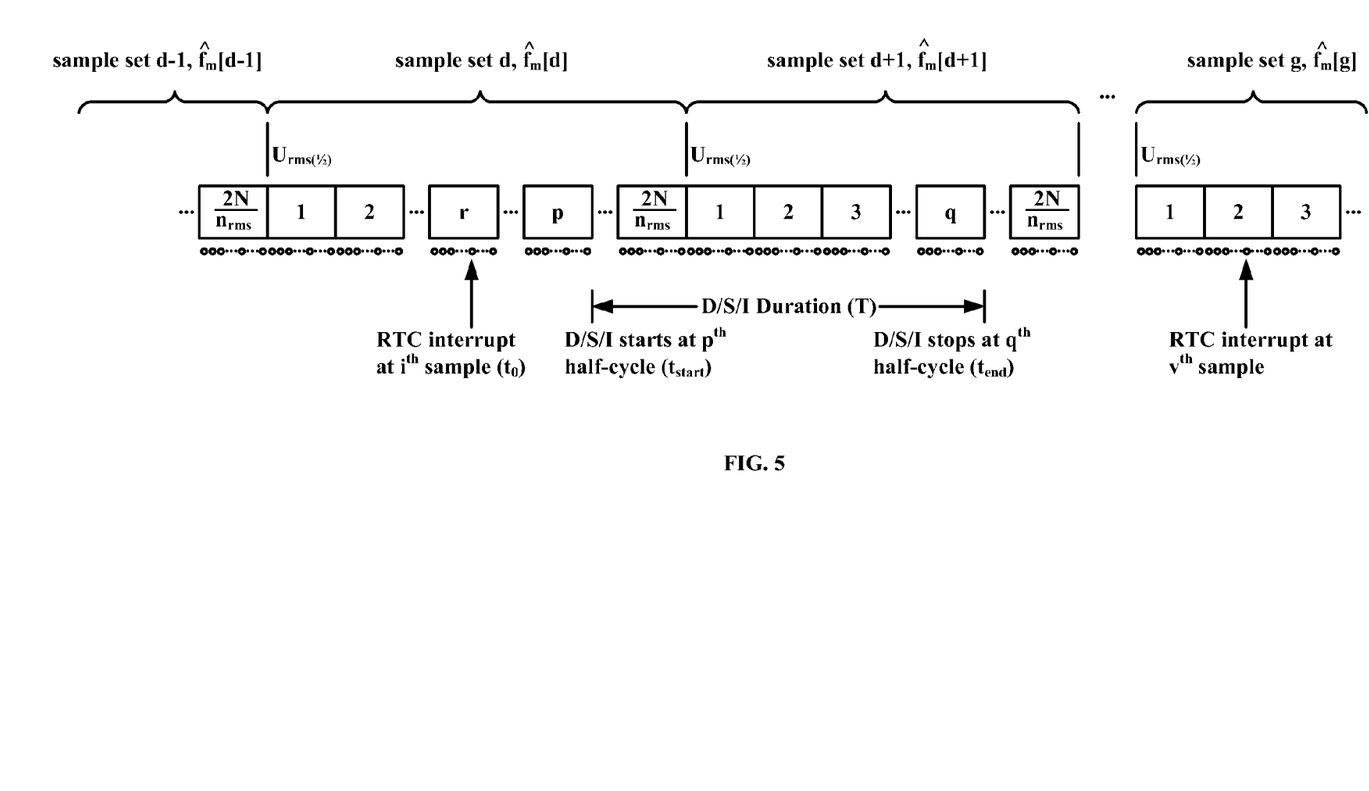
FIG. 5 is a diagram depicting an exemplary technique in accordance with this invention for calculating durations of and time stamping DSI Disturbances.

FIG. 5 illustrates consecutive sets (e.g., . . . , d−1, d, d+1, . . . , g, . . . ) of data samples, with each set including N samples of data $v_j[i]$ from a single voltage channel j. Each sample set includes $2N/n_{rms}$ half-cycles, with a corresponding $U_{rms(1/2)}$ value for each half-cycle. Further, FIG. 5 illustrates an example of a voltage dip/swell/interruption that starts at $p^{th}$ $U_{rms(1/2)}$ of a first sample set d and ends at $q^{th}$, $U_{rms(1/2)}$ of a second sample set d+1. Because of the overlap, each $U_{rms(1/2)}$ only has a half cycle new data and the dip/swell/interruption duration T can be obtained using the following equation:

$$T = \frac{\frac{2N}{n_{rms}} - p}{2 \times \widehat{f_m}[d]} + \frac{q}{2 \times \widehat{f_m}[d+1]} \quad (21)$$

Equation (21) also applies to dips, swells, and interruptions that start on one voltage channel and end on a different voltage channel. Persons of ordinary skill in the art will understand that equation (21) easily be extended for the situation when the start and end of the dip/swell/interruption are more than one sample set apart, (e.g., if the start of the dip/swell/interruption is at $p^{th}$ $U_{rms(1/2)}$ of $b^{th}$ sample set and ends at $q^{th}$ $U_{rms(1/2)}$ of $c^{th}$ sample set, then the duration is given by the following equation:

$$T = \frac{\frac{2N}{n_{rms}} - p}{2 \times \widehat{f_m}[b]} + \frac{\frac{2N}{n_{rms}}}{2 \times \widehat{f_m}[b+1]} + \ldots + \frac{\frac{2N}{n_{rms}}}{2 \times \widehat{f_m}[c-1]} + \frac{q}{2 \times \widehat{f_m}[c]} \quad (22)$$

When the dip/swell/interruption starts and ends in same data set such as $a^{th}$ data set, it is a special case of equation (22) above and the equation can be simplified as follows:

$$T = \frac{q - p}{2 \times \widehat{f_m}[a]} \quad (23)$$

As mentioned above, devices and methods in accordance with this invention optionally may time stamp the start and end of dips, swells, and interruptions. As shown in FIG. 1, exemplary power quality measurement device 10 includes real time clock 24, which sends an interrupt to DSP 20 at a fixed interval such as every 1 second. As shown in FIG. 5, the real time clock ("RTC") time stamp $t_0$ is associated with one sample (e.g., the $i^{th}$ sample in the $r^{th}$ $U_{rms(1/2)}$ calculation). The start and end of dips, swells, and interruption can be obtained using the following equations:

$$t_{start} = t_0 + \frac{n_{rms} - i}{f_m[1] \times n_{rms}} + \frac{p - r}{2 \times f_m[1]} \quad (24)$$

$$t_{end} = t_{start} + T \quad (25)$$

If RTC interrupt and the start of the dip/swell/interruption are not in the same sample set, (e.g., if RTC interrupt is at $i^{th}$ sample of the $r^{th}$ $U_{rms(1/2)}$ calculation in the $d^{th}$ sample set while the start of the dip/swell/interruption is at $p^{th}$ $U_{rms(1/2)}$ of the $k^{th}$ sample set, the following equations can be used to derive the time stamps:

$$t_{start} = t_0 + \frac{n_{rms} - i}{f_m[d] \times n_{rms}} + \frac{\frac{2N}{n_{rms}} - r}{2 \times f_m[d]} + \frac{\frac{2N}{n_{rms}}}{2 \times f_m[d+1]} + \ldots + \frac{\frac{2N}{n_{rms}}}{2 \times f_m[k-1]} + \frac{p}{2 \times f_m[k]} \quad (26)$$

$$t_{end} = t_{start} + T \quad (27)$$

The foregoing merely illustrates the principles of this invention, and various modifications can be made by persons of ordinary skill in the art without departing from the scope and spirit of this invention.

The invention claimed is:

1. A method for measuring characteristics of a power line signal having a fundamental frequency, the method comprising:
   estimating the fundamental frequency of the power line signal using a digital signal processor coupled to an analog-to-digital converter sampling the power line signal;
   generating a sampling clock based on the estimated fundamental power line frequency using a clock generator coupled to an output of the digital signal processor to receive a control signal from the digital signal processor representative of the estimated fundamental frequency of the power line signal;
   sampling the power line signal with the sampling clock using the analog-to-digital converter after generating the sampling clock with the clock generator, to generate data samples that include one or more complete cycles of the power line signal;
   using the digital signal processor to process the data samples to detect zero crossings of the power line signal; and
   using the detected zero crossings to calculate a U_rms(½) value, the r.m.s. voltage of the power line signal measured over one full cycle, commencing at a zero crossing, and refreshed each half-cycle.

2. The method of claim 1, wherein estimating the fundamental frequency of the power line signal comprises filtering samples of the power line frequency with a bandpass filter.

3. The method of claim 2, wherein estimating the fundamental frequency of the power line signal further comprises calculating a zero crossing of the power line signal based on the filtered samples of the power line signal.

4. The method of claim 3, wherein calculating the zero crossing comprises interpolating between filtered samples of the power line signal.

5. The method of claim 1, wherein power line signal comprises a multi-phase power line signal, and wherein estimating the fundamental frequency of the power line signal comprises estimating the fundamental frequency of a single phase of the power line signal.

6. The method of claim 1, wherein generating the sampling clock comprises generating the sampling clock at a multiple of the estimated fundamental power line frequency.

7. The method of claim 1, wherein processing the data samples comprises calculating a fundamental phase angle of the power line signal.

8. The method of claim 1, wherein processing the data samples comprises performing a discrete Fourier transform on the data samples to generate real and imaginary parts of the fundamental frequency component of the discrete Fourier transform results.

9. The method of claim 8, wherein processing the data samples further comprises calculating a fundamental phase angle of the power line signal based on the real and imaginary parts of the fundamental frequency component of the discrete Fourier transform results.

10. The method of claim 1, further comprising comparing the calculated U_rms(½) value to predetermined thresholds to determine if a dip, a swell or an interrupt has occurred on the power line.

11. The method of claim 10, further comprising measuring a duration of a detected dip, swell or interrupt.

12. The method of claim 10, further comprising associating a time stamp to a detected dip, swell or interrupt.

13. Apparatus for measuring characteristics of a power line signal having a fundamental frequency, the apparatus comprising:
means for estimating the fundamental frequency of the power line signal;
means for generating a sampling clock that is based on the estimated fundamental power line frequency;
means for sampling the power line signal with the sampling clock after generating the sampling clock, to generate data samples that include one or more complete cycles of the power line signal;
means for processing the data samples to detect zero crossings of the power line signal; and
means for using the detected zero crossings to calculate U_rms(½), the r.m.s. voltage of the power line signal measured over one full cycle, commencing at a zero crossing, and refreshed each half-cycle.

14. The apparatus of claim 13, wherein the means for estimating further comprises means for filtering samples of the power line frequency with a bandpass filter.

15. The method of claim 14, wherein the means for estimating further comprises means for calculating a zero crossing of the power line signal based on the filtered samples of the power line signal.

16. The apparatus of claim 15, wherein the means for calculating the zero crossing comprises means for interpolating between filtered samples of the power line signal.

17. The apparatus of claim 13, wherein power line signal comprises a multi-phase power line signal, and wherein the means for estimating comprises means for estimating the fundamental frequency of a single phase of the power line signal.

18. The apparatus of claim 13, wherein the mean for generating the sampling clock comprises means for generating the sampling clock at a multiple of the estimated fundamental power line frequency.

19. The apparatus of claim 13, wherein the means for processing the data samples comprises means for calculating a fundamental phase angle of the power line signal.

20. The apparatus of claim 13, wherein the means processing the data samples comprises means for performing a discrete Fourier transform on the data samples to generate real and imaginary parts of the fundamental frequency component of the discrete Fourier transform results.

21. The method of claim 20, wherein the means for processing the data samples further comprises means for calculating a fundamental phase angle of the power line signal based on the real and imaginary parts of the fundamental frequency component of the discrete Fourier transform results.

22. The apparatus of claim 13, further comprising means for comparing the calculated U_rms(½) value to predetermined thresholds to determine if a dip, a swell or an interrupt has occurred on the power line.

23. The apparatus of claim 22, further comprising means for measuring a duration of a detected dip, swell or interrupt.

24. The apparatus of claim 22, further comprising means for associating a time stamp to a detected dip, swell or interrupt.

25. Apparatus for measuring characteristics of a power line signal having a fundamental frequency, the apparatus comprising:
an analog-to-digital converter having input terminals coupled to the power line signal, a sampling clock input terminal coupled to a sampling clock having a sampling rate, and digital output terminals, wherein the A/D converter provides digital samples of the power line signal at the sampling rate at the digital output terminals;
a digital signal processor having input terminals coupled to the digital output terminals of the analog-to-digital converter, and an output terminal, wherein the digital signal processor processes the digital samples of the power line signal to estimate the fundamental frequency of the power line signal, and provides a control signal at the output terminal based on the estimated fundamental power line frequency; and
a programmable phase locked loop clock generator having a control terminal coupled to the output terminal of the digital signal processor, wherein the phase locked loop clock generator provides a clock signal that is based on the estimated fundamental power line frequency to the sampling clock input terminal of the analog-to-digital converter,
wherein the analog-to-digital converter further uses the clock signal to provide data samples of the power line signal at the digital output terminals after receiving the sampling clock signal, and the digital signal processor further processes the data samples to detect zero crossings of the power line signal.

26. The apparatus of claim 25, wherein the digital signal processor filters the digital samples with a bandpass filter.

27. The apparatus of claim 26, wherein the digital signal processor estimates the fundamental frequency of the power line signal by calculating a zero crossing of the power line signal based on the filtered digital samples.

28. The apparatus of claim 27, wherein the digital signal processor calculates the zero crossing by interpolating between the filtered digital samples.

29. The apparatus of claim 27, wherein the digital signal processor further processes the data samples to calculate a fundamental phase angle of the power line signal.

30. The apparatus of claim 25, wherein the digital signal processor further processes the data samples to detect zero crossings of the power line signal, and uses the detected zero crossings to calculate a U_rms(½) value, the r.m.s. voltage of the power line signal measured over one full cycle, commencing at a zero crossing, and refreshed each half-cycle.

* * * * *